United States Patent
Lin et al.

(10) Patent No.: US 7,453,762 B1
(45) Date of Patent: Nov. 18, 2008

(54) APPARATUS AND METHOD OF AUTO FREQUENCY CALIBRATION FOR TRANSDUCER

(75) Inventors: Kuang-Yeu Lin, Taoyuan County (TW); Lung-Chieh Chen, Changhua County (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 12/127,991

(22) Filed: May 28, 2008

(51) Int. Cl.
*H03L 7/04* (2006.01)
(52) U.S. Cl. ......................................... 367/13; 367/902
(58) Field of Classification Search .................. 367/13, 367/902; 331/34
See application file for complete search history.

(56) References Cited

U.S. PATENT DOCUMENTS

2003/0067841 A1* 4/2003 Amaral et al. ................ 367/13

* cited by examiner

*Primary Examiner*—Dan Pihulic
(74) *Attorney, Agent, or Firm*—WPAT.,P.C.; Justin King

(57) ABSTRACT

An apparatus for automatically calibrating a transducer are disclosed in the present invention, the apparatus comprising: an oscillator, for generating a system frequency; a micro controller, being coupled to the oscillator, for receiving the system frequency; a counting unit, being installed inside the micro processor, for generating at least a clock signal according to the system frequency; a transformer, whose input terminal is being coupled to the counting unit, for receiving the clock signal and transferring the clock signal to be a plurality of exciting signals, the output terminal feedbacks and couples the exciting signals to the interrupting signal input terminal of the micro controller, wherein the a plurality of exciting signals comprising at least a primary oscillating signal and at least a secondary oscillating signal and the amount of the clock signal equals to that of the primary oscillating signal; and a transducer, whose input terminal is being coupled to the transformer, and the transducer is being excited by the exciting signals to generate an output signal. Thus, the micro controller can be dynamically calibrating the frequency of the exciting signal according to the output signal variation of the transducer, and the best transmitting effect can be achieved without being suffered from the variation of external environment such as the temperature, humidity change.

18 Claims, 3 Drawing Sheets

APPARATUS AND METHOD OF AUTO FREQUENCY CALIBRATION FOR TRANSDUCER

BACKGROUND OF THE INVENTION

1. Field of the Invention

The present invention relates to an apparatus and method for auto frequency calibration for a transducer, more particularly to, the apparatus and method enabling a micro controller to dynamically calibrate the frequency of exciting signals according to the change of the output signal frequency of a the transducer.

2. Description of the Related Art

The conventional ultrasonic transducer while being applied to the distance measurement usually adopts the elements as follows: (1) a micro controller: for generating a frequency of the exciting signal equivalent to the output signal frequency of said transducer; (2) a transformer: for ascending the voltage of the clock signal for the transducer; (3) a transducer: for emitting and receiving an ultrasonic signal; (4) an amplifier: for amplifying the small signal received by said transducer. The signal frequency generated by the conventional micro controller is fixed and independent from the variation of the elements or temperature. Such an application relies on an accurate transducer with high manufacturing cost and disadvantage to the product price.

Hence, it is imperative how to come out an apparatus for auto calibration for a transducer and the method therefore, by the approach so as the micro controller can be dynamically calibrating the frequency of the exciting signal according to the output signal variation of the transducer, and the best transmitting effect can be achieved without being suffered from the variation of external environment such as the temperature, humidity change.

SUMMARY OF THE INVENTION

In view of the disadvantages of prior art, the primary object of the present invention relates to an apparatus for an automatically calibrating a transducer and the method therefor for solving the problem for which the conventional micro controller cannot dynamically calibrate the frequency of exciting signals according to the frequency change of transducer output signal.

According to one aspect of the present invention, the present invention relates to an apparatus automatically calibrating a transducer, comprising: an oscillator, for generating a system frequency; a micro controller, being coupled to the oscillator, for receiving the system frequency; a counting unit, being installed inside the micro processor, for generating at least a clock signal according to the system frequency; a transformer, whose input terminal is being coupled to the counting unit, for receiving the clock signal and transferring the clock signal to be a plurality of exciting signals, the output terminal feedbacks and couples the exciting signals to the interrupting signal input terminal of the micro controller, wherein said a plurality of exciting signals comprising at least a primary oscillating signal and at least a secondary oscillating signal and the amount of the clock signal equals to that of the primary oscillating signal; and a transducer, whose input terminal is being coupled to the transformer, and the transducer is being excited by the exciting signals to generate an output signal According to another aspect of the present invention, the present invention relates to a method for automatically calibrating a transducer, comprising the steps of the follows: (1) Setting the time parameter of a counting unit, wherein said counting unit is installed in a micro controller; (2) Enabling said counting unit to generate at least a clock signal; (3) Enabling said clock signal to be inputted to a transformer and to transfer said clock signal to be a plurality of exciting signals, wherein said exciting signals comprising at least a primary oscillating signal and at least a secondary oscillating signal; (4) Enabling a transducer to transfer the exciting signals to be a plurality of output signal to output; (5) Enabling said a plurality of exciting signals to be feedback to said micro controller; and (6) Enabling said counting unit to calculate the output frequency of said transducer according to said secondary oscillating signal.

Hence, the micro controller can dynamically calibrate the frequency of the exciting signal according to the output signal frequency change of the transducer, and the best transmitting effect can be achieved at the time of the external environment change such as the temperature or humidity variation.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the elements described. For your esteemed members of reviewing committee to further understand and recognize the fulfilled functions and structural characteristics of the invention, several exemplary embodiments cooperating with detailed description are presented as the follows.

Figure 1:
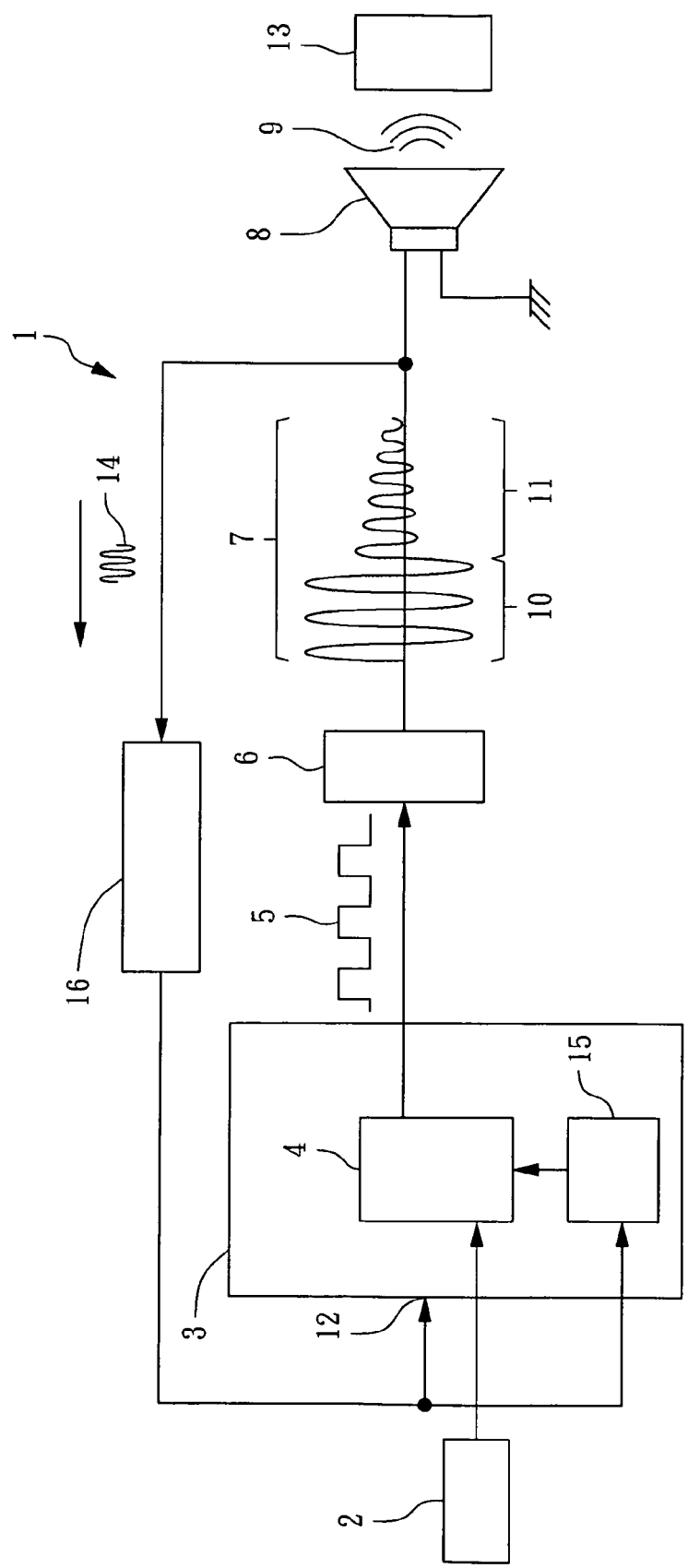
FIG. 1 relates to a block diagram of an apparatus for automatically calibrating a transducer according to the present invention.
Figure 2:
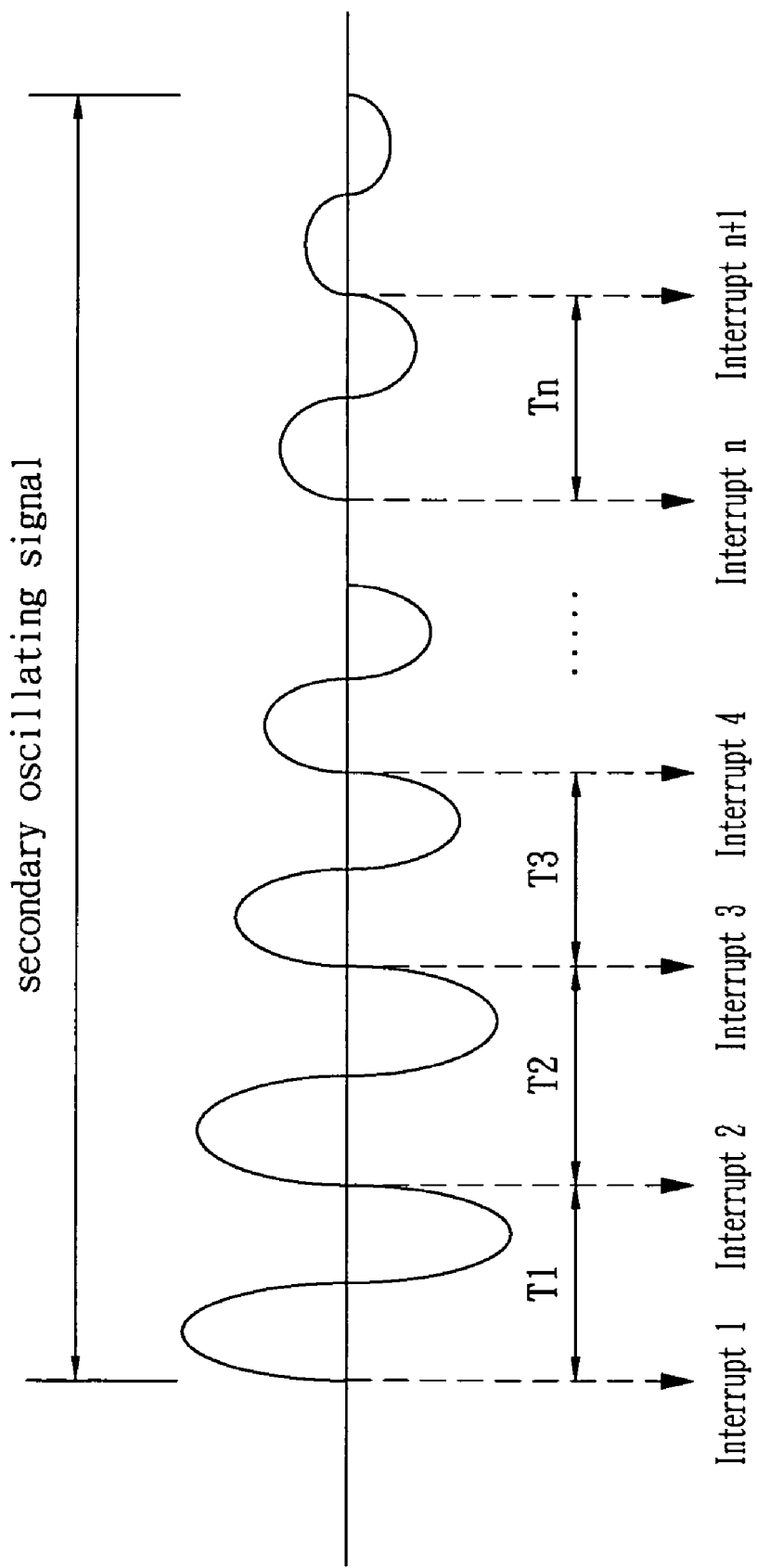
FIG. 2 relates to a waveform plot of a secondary oscillating signal according to the present invention.

FIG. 1 and FIG. 2 are the system diagram and the waveform view of the apparatus of dynamically correction transducer of the present invention respectively. Please refer to FIG. 1 and FIG. 2 simultaneously. An auto frequency calibration for a transducer apparatus 1 comprising: an oscillator 2, for generating a system frequency; a micro controller 3, being coupled to said oscillator, for receiving the system frequency; a counting unit 4, being installed inside said micro controller, for generating at least a clock signal 5 (For example, a square wave but not limited hereto) according to the system frequency; a transformer 6, whose input terminal is being coupled to the counting unit 4, for receiving the clock signal 5 and transferring the clock signal 5 to be a plurality of exciting signals 7 (For example, a sinusoidal wave but not limited hereto), the output terminal feedbacks and couples the exciting signals 7 to the interrupting signal input terminal 12 of the micro controller 3, wherein said a plurality of exciting signals 7 comprising at least a primary oscillating signal 10 and at least a secondary oscillating signal 11 and the amount of the clock signal equals to that of the primary oscillating signal 10; and a transducer 8, whose input terminal is being coupled to the transformer 6, and said transducer 8 is being excited by the exciting signals 7 to generate an output signal 9 (For example, wireless output signal) for output. In order to calibrate the voltage reference of said a plurality of exciting signals 7, preferably, the apparatus disclosed in the present invention further comprises a voltage clamping unit 16, said voltage clamping unit 16 is disposed between the output terminal of said transformer 6 and the interrupt signal input terminal 12 of said micro controller 3, and at the time of said output signal 9 being transmitted to an object 13, said object 13 reflects a reflecting signal 14 to said transducer 8, and feedbacks said reflecting signal 14 to said micro controller 3 via said voltage clamping unit 16, therefore, preferably, the apparatus disclosed in the present invention further comprises an amplifier 15 installed in said micro controller 3, said amplifier 15 is being coupled to said voltage clamping unit 16 in order to amplify said reflecting signal 14, and at the time of all of said exciting signal 7 being generated, said amplifier 15 is then turned on in order to amplify said reflecting signal 14. And for calculating the frequency of the output signal 9 of said transducer 8, preferably, the disclosure of the present invention suggests that at the time of all of said clock signals 5 being generated, said calculating unit 4 bases on said secondary oscillating signal 11 to the interrupting period of said interrupting signal input terminal 12 to calculate the frequency of output signals 9 of said transducer 8. (As illustrated in FIG. 2) At each interrupt triggering the counting values will be recorded, generally in the calculating unit 4. Hence, the average period can be obtained as: $T_{average}=(T1+T2+\ldots+TN)/N)$ and the output signal 9 of said transducer 8 can be calculated by counting down so as to dynamically calibrate the frequency of said exciting signal 7.

Figure 3:
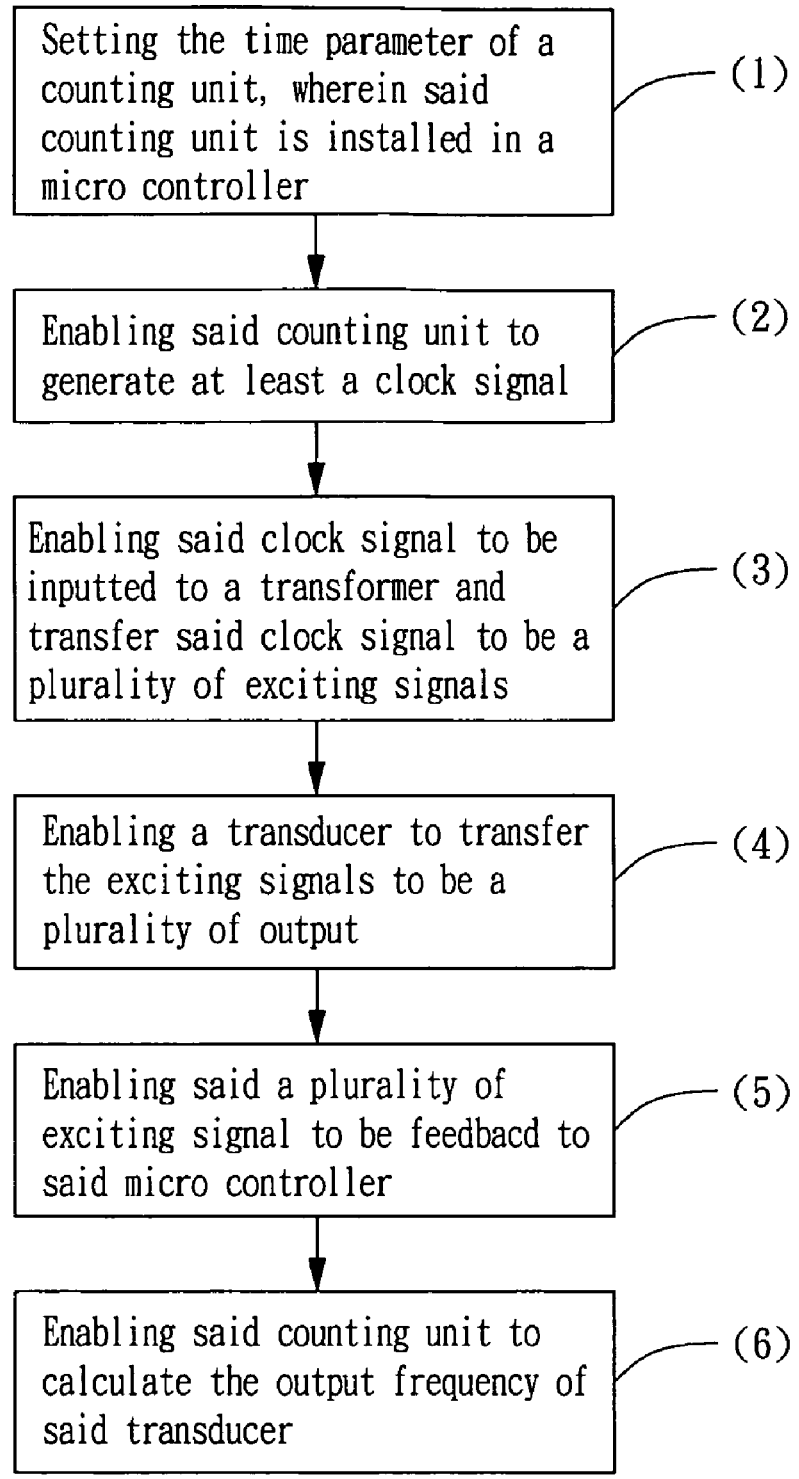
FIG. 3 relates to a flow chart of the method for automatically calibrating a transducer according to the present invention.

FIG. 3 relates to a flow chart of the method for automatically calibrating a transducer disclosed in the present invention, wherein said method comprising the steps as follows:

(1) Setting the time parameter of a counting unit, wherein said counting unit is installed in a micro controller;

(2) Enabling said counting unit to generate at least a clock signal (For example, a square wave but not limited hereto);

(3) Enabling said clock signal to be inputted to a transformer and to transfer said clock signal to be a plurality of exciting signals (For example, a sinusoidal wave but not limited hereto), wherein said exciting signals comprising at least a primary oscillating signal and at least a secondary oscillating signal;

(4) Enabling a transducer to transfer the exciting signals to be a plurality of output signals to output;

(5) Enabling said a plurality of exciting signal to be feedback to said micro controller, preferably, said micro controller further comprises voltage clamping unit, said voltage clamping unit is disposed between the output terminal of said transformer and the interrupt signal input terminal of said micro controller and at the time of said wireless output signals being transmitted to an object, said object will reflect a reflecting signal back to said transducer and enable said reflecting signal feedback to said micro controller via said voltage clamping unit. Therefore, preferably in the present invention, said micro controller further comprises an amplifier to be installed inside the micro controller, and said amplifier is turned on to amplify said reflecting signal until all of said exciting signals are generated; and (6) Enabling said counting unit to calculate the output frequency of said transducer according to said secondary oscillating signal.

Thus, the micro controller can be dynamically calibrating the frequency of the exciting signal according to the output signal variation of the transducer, and the best transmitting effect can be achieved without being suffered from the variation of external environment such as the temperature, humidity change.

The invention being thus aforesaid, it will be obvious that the same may be varied in many ways. The present invention disclosed an apparatus and method for automatically calibrating a transducer. Such variations are not to be regarded as a departure from the spirit and scope of the invention, and all such modifications as would be obvious to one skilled in the art are intended to be included within the scope of the following claims.

We claim:

1. An apparatus for auto frequency calibration for a transducer, comprising:

an oscillator, for generating a system frequency;

a micro controller, being coupled to said oscillator, for receiving the system frequency;

a counting unit, being installed inside said micro controller, for generating at least a clock signal according to the system frequency;

a transformer, whose input terminal is being coupled to the counting unit, for receiving the clock signal and transferring the clock signal to be a plurality of exciting signals, the output terminal feedbacks and couples the exciting signals to the interrupting signal input terminal of the micro controller, wherein said a plurality of exciting signals comprising at least a primary oscillating signal and at least a secondary oscillating signal and the amount of the clock signal equals to that of the primary oscillating signal; and a transducer, whose input terminal is being coupled to the transformer, and said transducer is being excited by the exciting signals to generate an output signal.

2. The apparatus as set forth in claim 1, further comprising a voltage clamping unit, said voltage clamping unit is disposed between the output terminal of said transformer and the interrupt signal input terminal of said micro controller so as to calibrate the voltage reference of said a plurality of exciting signal.

3. The apparatus as set forth in claim 2, wherein said a plurality of output signals are wireless output signals.

4. The apparatus as set forth in claim 3, wherein when said wireless output signals are transmitted to an object, said object will reflect a reflecting signal back to said transducer and enable said reflecting signal feedback to said micro controller via said voltage clamping unit.

5. The apparatus as set forth in claim 4, further comprising an amplifier installed in said micro controller, said amplifier is being coupled to said voltage clamping unit to amplify said reflecting signal.

6. The apparatus as set forth in claim 5, wherein said amplifier is turned on to amplify said reflecting signal when all of said exciting signals are generated.

7. The apparatus as set forth in claim 1, wherein said counting unit bases on said secondary oscillating signal to the interrupting period of said interrupting signal input terminal to calculate the frequency of output signals of said transducer when all said clock signals are generated.

8. The apparatus as set forth in claim 1, wherein said clock signal is square wave.

9. The apparatus as set forth in claim 1, wherein said clock signal is sinusoidal wave.

10. A method for auto frequency calibration for a transducer, comprising the steps as follows:
   (1) Setting the time parameter of a counting unit, wherein said counting unit is installed in a micro controller;
   (2) Enabling said counting unit to generate at least a clock signal;
   (3) Enabling said clock signal to be inputted to a transformer and to transfer said clock signal to be a plurality of exciting signals, wherein said exciting signals comprising at least a primary oscillating signal and at least a secondary oscillating signal;
   (4) Enabling a transducer to transfer the exciting signals to be a plurality of output signals to output;
   (5) Enabling said a plurality of exciting signal to be feedback to said micro controller; and
   (6) Enabling said counting unit to calculate the output frequency of said transducer according to said secondary oscillating signal.

11. The method as set forth in claim 10, wherein said transducer further comprises a voltage clamping unit, said voltage clamping unit is disposed between the output terminal of said transformer and the interrupt signal input terminal of said micro controller so as to calibrate the voltage reference of said a plurality of exciting signal.

12. The method as set forth in claim 11, wherein said output signals are wireless output signals.

13. The method as set forth in claim 12, wherein when said wireless output signals are transmitted to an object, said object will reflect a reflecting signal back to said transducer and enable said reflecting signal feedback to said micro controller via said voltage clamping unit.

14. The method as set forth in claim 13, wherein said transducer further comprises an amplifier installed in said micro controller, said amplifier is being coupled to said voltage clamping unit to amplify said reflecting signal.

15. The method as set forth in claim 13, wherein said amplifier is turned on to amplify said reflecting signal when all of said exciting signals are generated.

16. The method as set forth in claim 10, wherein said counting unit bases on said secondary oscillating signal to the interrupting period of said interrupting signal input terminal to calculate the frequency of output signals of said transducer when all said clock signals are generated.

17. The method as set forth in claim 10, wherein said clock signal is square wave.

18. The method as set forth in claim 10, wherein said clock signal is sinusoidal wave.

* * * * *